United States Patent
Ziarati et al.

(10) Patent No.: US 12,411,193 B2
(45) Date of Patent: *Sep. 9, 2025

(54) FLEXIBLE OR CURVED DISPLAY FOR MRI BORE

(71) Applicant: Resonance Technology, Inc., Northridge, CA (US)

(72) Inventors: Mokhtar Ziarati, North Hollywood, CA (US); Parisa Ziarati, Granada Hills, CA (US)

(73) Assignee: Resonance Technology, Inc., Northridge, CA (US)

( * ) Notice: Subject to any disclaimer, the term of this patent is extended or adjusted under 35 U.S.C. 154(b) by 7 days.

This patent is subject to a terminal disclaimer.

(21) Appl. No.: 18/630,465

(22) Filed: Apr. 9, 2024

(65) Prior Publication Data
US 2024/0259545 A1   Aug. 1, 2024

Related U.S. Application Data

(63) Continuation of application No. 17/568,627, filed on Jan. 4, 2022, now Pat. No. 11,962,750, which is a continuation of application No. 16/923,425, filed on Jul. 8, 2020, now Pat. No. 11,233,984.

(60) Provisional application No. 62/983,461, filed on Feb. 28, 2020.

(51) Int. Cl.
*H04N 13/302* (2018.01)
*G01R 33/28* (2006.01)
*G02B 30/25* (2020.01)
*H04N 13/337* (2018.01)
*H05K 9/00* (2006.01)
*H10K 59/126* (2023.01)
*H10K 77/10* (2023.01)
*H10K 59/00* (2023.01)
*H10K 102/00* (2023.01)

(52) U.S. Cl.
CPC .......... *G01R 33/283* (2013.01); *G02B 30/25* (2020.01); *H04N 13/302* (2018.05); *H04N 13/337* (2018.05); *H05K 9/0086* (2013.01); *H10K 59/126* (2023.02); *H10K 77/111* (2023.02); *H04N 2213/001* (2013.01); *H04N 2213/008* (2013.01); *H10K 59/00* (2023.02); *H10K 2102/311* (2023.02)

(58) Field of Classification Search
CPC .. G01R 33/283; H04N 13/337; H04N 13/302; G02B 30/25; H10K 59/126; H10K 77/111; H05K 9/0086
See application file for complete search history.

(56) References Cited

U.S. PATENT DOCUMENTS

2007/0291325 A1* 12/2007 Toyota ................... H04N 1/195 348/E5.091
2015/0286063 A1* 10/2015 Liao ..................... G02B 5/3083 359/464
2016/0320463 A1* 11/2016 O'Neill ................. G06F 3/045

(Continued)

*Primary Examiner* — Jonathan R Messmore
(74) *Attorney, Agent, or Firm* — Larry K. Roberts

(57) ABSTRACT

A display structure suitable for use inside an MRI system bore to display images to a patient undergoing an MRI procedure. The display structure includes a curved display configured for fitting inside the MRI bore, and having a width and length sufficient to present images to the patient inside the tunnel. First and second EMI shielding layers sandwich the curved display.

18 Claims, 6 Drawing Sheets

(56) References Cited

U.S. PATENT DOCUMENTS

| | | | | |
|---|---|---|---|---|
| 2017/0115489 A1* | 4/2017 | Hu | ............... | G02B 27/0172 |
| 2018/0069127 A1* | 3/2018 | Yang | ............... | H10D 30/6758 |
| 2019/0012007 A1* | 1/2019 | Kim | ............... | G06F 1/1652 |
| 2019/0231229 A1* | 8/2019 | Sturgeon | ............... | A61B 5/748 |
| 2020/0154076 A1* | 5/2020 | Russell | ............... | H04N 7/15 |
| 2020/0289075 A1* | 9/2020 | Anderson | ............... | A61B 6/547 |

* cited by examiner

FLEXIBLE OR CURVED DISPLAY FOR MRI BORE

CROSS-REFERENCE TO RELATED APPLICATIONS

This application is a continuation of Non-provisional application Ser. No. 17/568,627, filed Jan. 4, 2022, which in turn is a continuation of Non-provisional application Ser. No. 16/923,425, filed Jul. 8, 2020, which in turn claims the benefit of U.S. Provisional Application No. 62/983,461 filed Feb. 28, 2020, the entire contents of which applications are hereby incorporated by reference.

BACKGROUND OF THE INVENTION

The magnetic resonance imaging (MRI) tunnel or bore is a tight tunnel and for some patients creates claustrophobia effect. For the past 25 years or so, there have been many different technologies to overcome the issue of claustrophobia for the patients undergoing the MRI procedures.

Some solutions in the past have been effective, but there is room for better technology with lower cost, ease of use and improved effectiveness than the current systems.

Following are descriptions of several systems in the market today.

Projection systems are known. A screen is located on either end of the magnet bore while patients look through a reflective mirror to watch the screen. This method is time-consuming and, depending on the type of procedure. For example, in a lumbar scan procedure, the patient's feet go inside the bore first. Therefore, using a reflective mirror will not work, as the patient will not see the display because the stomach will block the view of the screen.

Another system uses an LCD panel on the back and outside of the bore and is similar to the Projection System.

Virtual reality goggles are more effective because patients cannot see that they are inside the tunnel of the MRI. There are some issues such as that the goggle might not fit all the patients during the head scan, due to the small size of the head coil and because some patients have large heads.

Another system uses a projection screen with the actual screen inside the bore, with the screen attached to the table moving with the patients. This has disadvantages, in that the patient is still aware of the ceiling of the MRI bore, and using a mirror to see the screen is not practical for all the scans, particularly if the patient goes inside the bore with feet in first. It is also very costly.

In most of the new MRI suites, the building manufacturer adds a color changing LED in order to make the room feel more pleasant, but once the patient is inside the bore, they cannot see the outside color-changing LED.

Another system may have a system with an LCD panel outside the bore with a built-in mirror for the patient to see the LCD panel. Some MRI magnet rooms may have an LCD monitor hung from the ceiling for the patient to see some videos before being moved into the MRI bore for an imaging procedure.

BRIEF DESCRIPTION OF DRAWINGS

Features and advantages of the disclosure will readily be appreciated by persons skilled in the art from the following detailed description when read in conjunction with the drawing wherein.

DETAILED DESCRIPTION OF THE INVENTION

Figure 1:
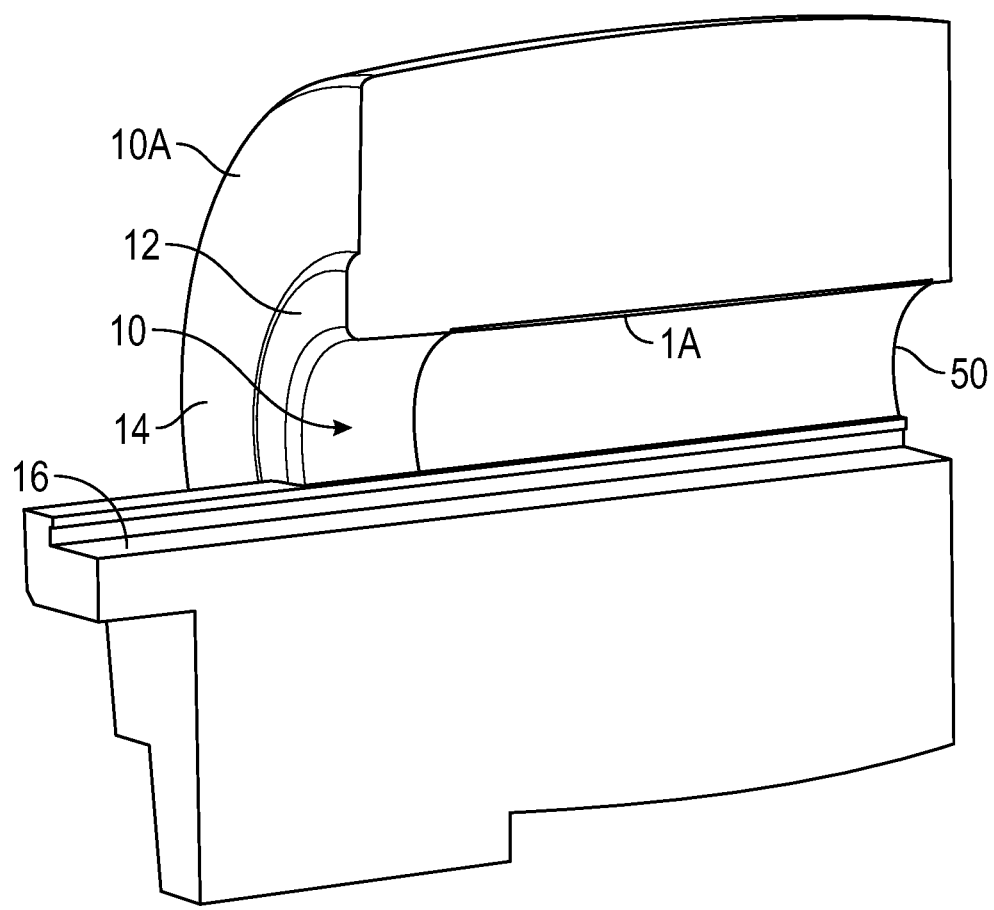
FIG. 1 is diagrammatic longitudinal cutaway view of an MRI bore illustrating aspects of an embodiment of a display system.

In the following detailed description and in the several figures of the drawing, like elements are identified with like reference numerals. The figures are not to scale, and relative feature sizes may be exaggerated for illustrative purposes.

With the advance of flexible display technology, the ceiling of the MRI bore or tunnel can be made into a giant and beautiful display screen, so as the patient enters the bore regardless of the type of procedure, the patient can feel as if he/she is entering a movie theater. Since the new flexible display may be less than a few mm thick and can be applied to the entire top 180-degree part of the bore and for all the studies, except the breast imaging exam, the patients can enjoy the display. In the case of a breast exam, the patient may look through a mirror to see the top of the bore and still see the display screen. In other embodiments, the screen may extend over a smaller sector of the bore, e.g., 45 degrees or so.

The MRI bore cylinder is typically either 60 cm or 70 cm in diameter, and in general the patient's head 20 (FIGS. 2A, 2B) is positioned in the center of the bore cylinder. The distance from the patient's eyes to the inner wall of the bore cylinder (distance D in FIG. 2B) is about 25 cm or 30 cm, depending on the bore diameter. It is expected that most patients are able to bring images displayed on the bore cylinder wall into focus. However, for patients who need the virtual image to be closer or further away, the patient may use reading glasses. The reading glasses suitable for use in an MRI application will be non-magnetic.

Another advancement to this technology is that by applying passive three-dimensional (3D) features to the flexible display, the virtual image the patient can be immersed in an even more comforting and relaxed atmosphere. U.S. Pat. No. 9,661,313 (the entire contents of which are incorporated herein by this reference) describes one technique of creating 3D is to use a polarized screen over the display, so the right eye views a different image than the left eye by the patent wearing polarized goggles or glasses. U.S. Pat. No. 9,661,313 describes the use of FPR (film patterned retarder)

technology, in which the 3D glasses use left and right circularly polarized filters to separate the left and right images. FPR 3D displays incorporate the FPR technology in which a polarized film is placed on the 3D display screen to effectively split the left and right images into interweaving odd and even lines onscreen, and along with the 3D glasses which use circular polarization filters of opposite sense, separates the left and right images before they are delivered to the brain. This technically halves the original resolution of 3D content to each eye. The images are then combined by the brain to create the 3D impression. U.S. Pat. Nos. 9,207,460 and 9,897,817 describe examples of FPR display technologies, and their contents are respectively incorporated herein by this reference.

The technology behind passive 3D TV is similar to how 3D movies are presented in cinemas. Two slightly different images—one for each eye—comprise each frame displayed by the TV. One is displayed so that it is polarized vertically, and the other so that it is polarized horizontally.

The 3D glasses used by passive 3D TVs are just like those used in the theater and do not require any power. Each lens in the glasses is polarized to let a different image through, one horizontal and one vertical. When each eye sees a slightly different version of the same combined frame, the illusion of 3D is created. Here again, the 3D glasses are non-magnetic for use in MRI applications.

Since they do not require any power or contain any electronics, passive 3D glasses are ideal to be used for the patients in the MRI scan.

Glasses-free 3D is another method of creating 3D display for the viewer. Autostereoscopic 3D TV is not widely available now, but it is considered by some to be the future of 3D TV because it does not require viewers to wear glasses. It most commonly uses a technology called "parallax barrier." Parallax barrier refers to a special material on the screen with tiny slits in it that allow one image to be shown only to the left eye and another image to be shown only to the right eye. These slightly different images are what create the 3D effect. U.S. Pat. No. 8,436,787, the entire contents of which are incorporated herein by this reference, describes exemplary autostereoscopic 3D display devices.

There are several flexible display manufacturers, such as BOE Display and Royole, as well as Samsung and LG. Typically, once the display is installed in the MRI tunnel, it will not be flexed by the user, but will rather be fixed in place as a curved display structure, by fasteners, adhesive, bracketry or other devices.

MRI manufacturers may build this technology inside the MRI bore or tunnel during the manufacture as a standard part of the MRI system and reduce claustrophobia for good. Alternatively, the display system may be fitted to existing MRI systems.

FIG. 1 is a diagrammatic cutaway view of a typical MRI system, showing the bore 10 within the MRI magnet enclosures 12 and 14. The structures 12 and 14 may be integrated, and enclose the RF and gradient coils parts of the MRI system such as the magnet coil windings. The patient table (not shown in FIG. 1) rides on cradle support structure 16, so that the table and patient can be moved into and out of the bore to position the patient for an MRI procedure.

Figure 2B:
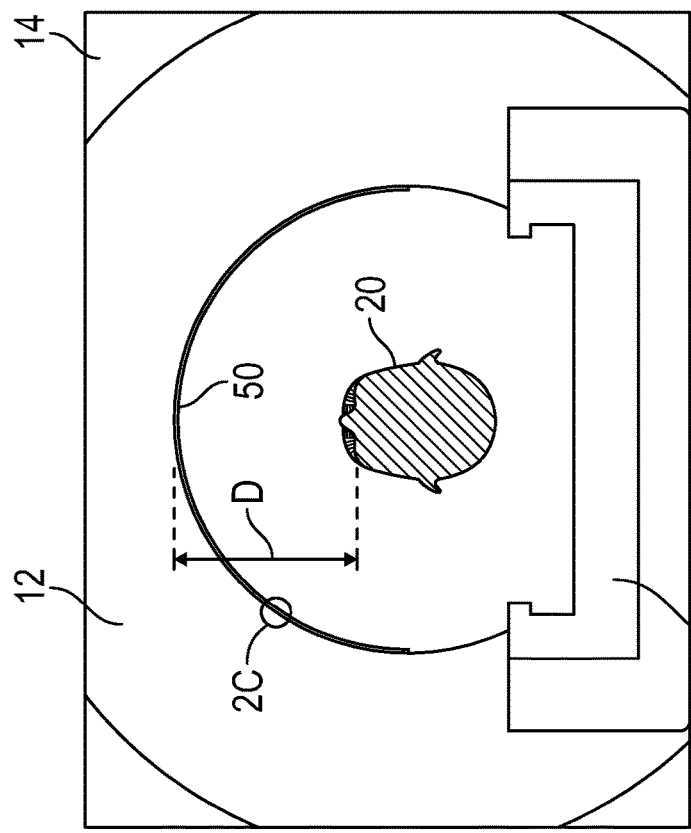
FIG. 2B is a diagrammatic transverse cutaway view showing the position of a patient's head in the MRI bore and the position of the display panel in an exemplary embodiment.
Figure 2A:
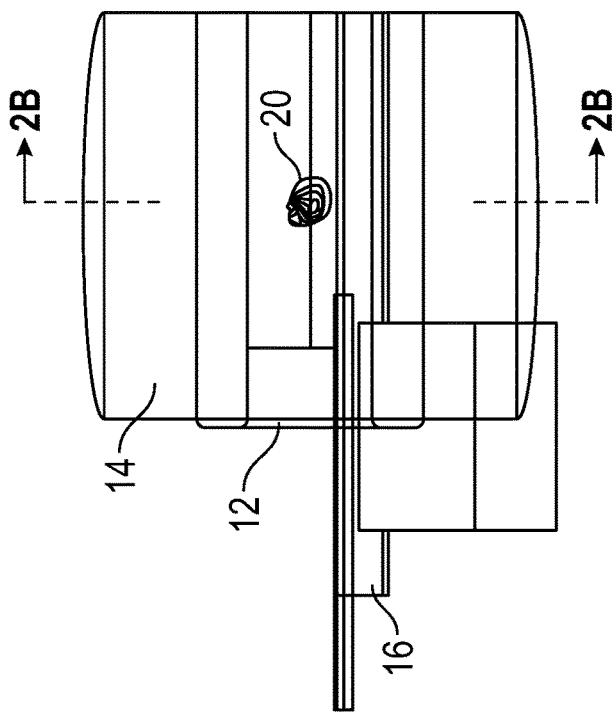
FIG. 2A is a diagrammatic side view of an MRI magnet.
Figure 3:
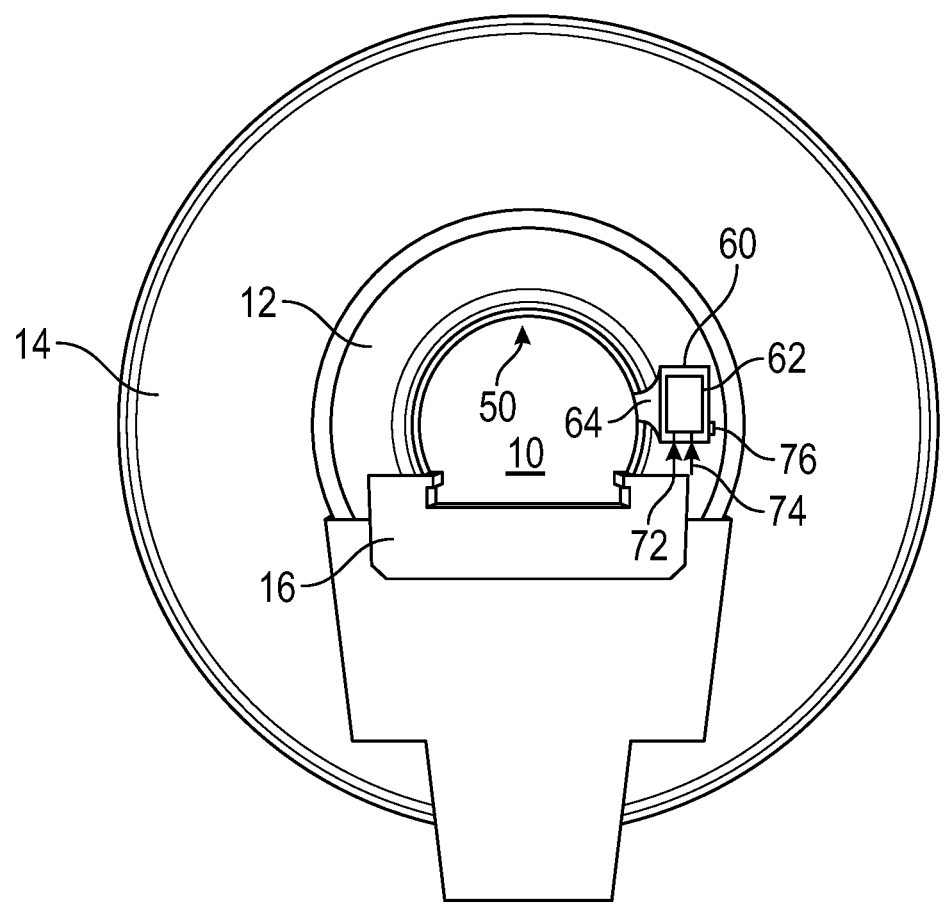
FIG. 3 is a diagrammatic transverse cutaway view of the embodiment of FIG. 1 and the MRI bore.

The display screen 50 is applied or supported against the surface of the bore 12 above and encircling the table support 16, generally exceeding 180 degrees of the circumference of the bore, as illustrated in FIGS. 2B and 3. The screen 50 has a length extending from the input side edge 10A of the bore to a position above the patient's head when fully inserted on the table into the bore. In an exemplary embodiment, the bore has a typical diameter of 60 cm or 70 cm, and the screen dimensions may be two meters by one meter (with the screen in a flat configuration (FIG. 5A) prior to assembly into the bore) to cover the entire length of the MRI bore. Other dimensions may be employed, depending on the application. For example, a smaller screen may be placed above the patient's head 20 in the bore, having a longitudinal (along the bore axis) of 20 cm or so. Alternatively, the screen may extend 200 cm or longer, depending on the bore dimensions.

Figure 2C:
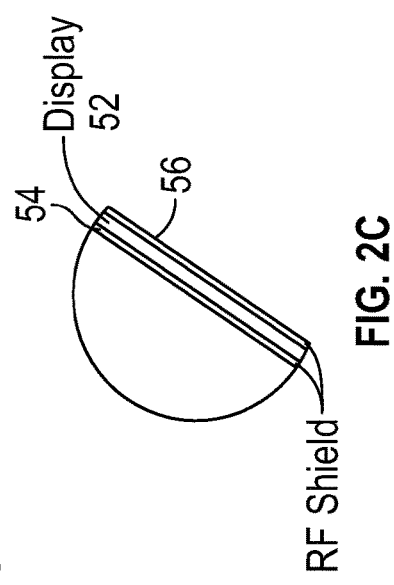
FIG. 2C is a diagrammatic close-up cutaway view of a portion of the curved display structure within dashed circle 2C of FIG. 2B.
Figure 5A:
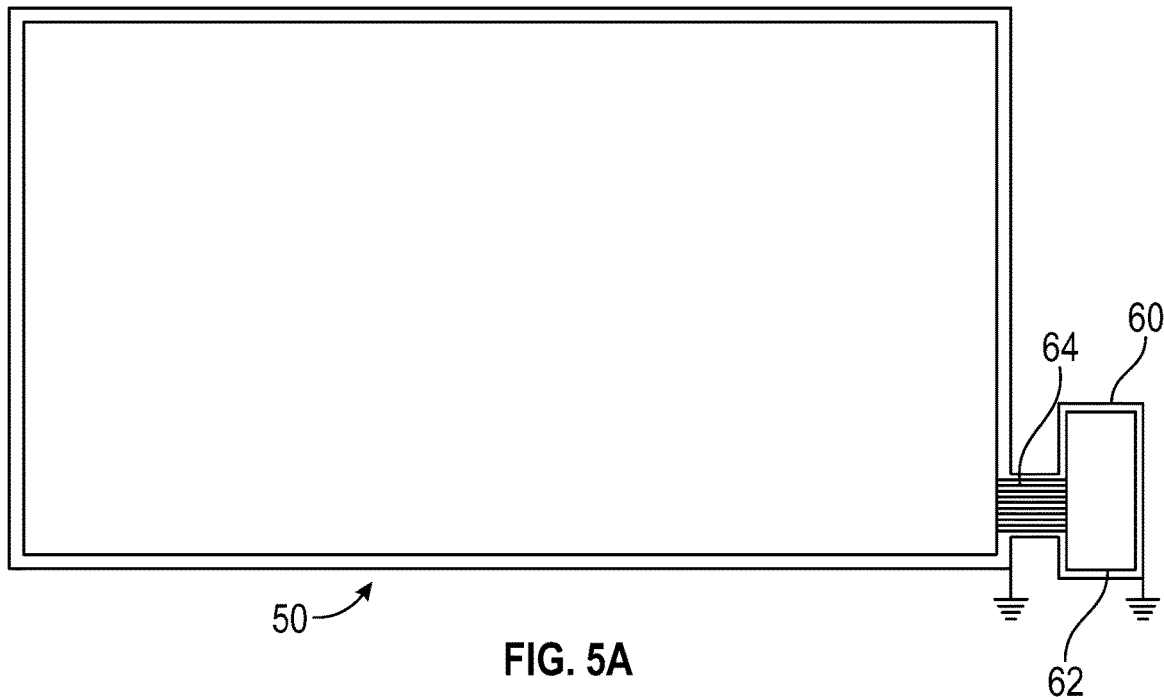
FIG. 5A is a diagrammatic top schematic view of a display system, with the display panel in a flat condition prior to being curved and attached inside the MRI bore.

FIG. 2C is a diagrammatic close-up cutaway view of a portion of the curved display structure 50 within dashed circle 2C of FIG. 2B. The display structure 50 in this exemplary embodiment includes the display layer 52, an active matrix organic light emitting diode (AMOLED) display, sandwiched between EMI (electromagnetic interference) shield layer 54 and EMI layer 56 which faces into the bore 10. The layer 54 is positioned against the interior surface of MRI structure 12. The purpose of the layers 54 and 56 is to shield the MRI system from being affected by the display drive signals. Layers 54 and 56 are RF shielding, for example formed by a very fine micro mesh almost invisible to the naked eyes to sandwich the AMOLED display for blocking the display noise EMI from radiating outside of the mesh to the MRI environment. Tungsten micro mesh is a preferred material for the EMI shielding in the MRI tube, although copper or alloys of copper or tungsten are also examples. An exemplary mesh opening size is on the order of 50 mesh openings per square inch. The edges of the EMI layers 54 and 56 surrounding the display are electrically connected and grounded, as depicted in FIG. 5A, for example, to form a Faraday cage.

For large-scale production, the factory can apply the mesh for layers 54 and 56. Another method is to laminate each mesh layer to a sheet of optically clear flexible plastic and then sandwich the AMOLED in between the EMI shield layers, with the power ground of the display connected to the shield layers.

FIG. 3 further illustrates features of the MRI display system, which includes the curved display structure 50, and display electronics module 62 mounted inside EMI shielded interface housing 60. The module 62 is the driver for the display, and is non-magnetic. The module 62 can be attached to the side of the magnet or hidden under the MRI back cover, for example. The housing 60 provides shielding to prevent electromagnetic signals from the electronics module from escaping outside the housing and affecting the quality of the MRI imaging process. The display electronics module is connected to the display structure 50 by ribbon cable 64, fabricated of non-ferrous materials. The housing 60 may also be mounted outside the MRI bore adjacent edge 10A, for example. The housing 60 is fabricated of non-ferrous materials.

The display structure 50, the housing 60 and module 62 are fabricated to have electromagnetic compatibility (EMC) with the MRI imaging system, i.e. to limit emission and reception of electromagnetic energy which may cause unwanted effects on the imaging system. This is accomplished by the use of non-magnetic elements and EMI shielding of the display components.

Figure 5B:
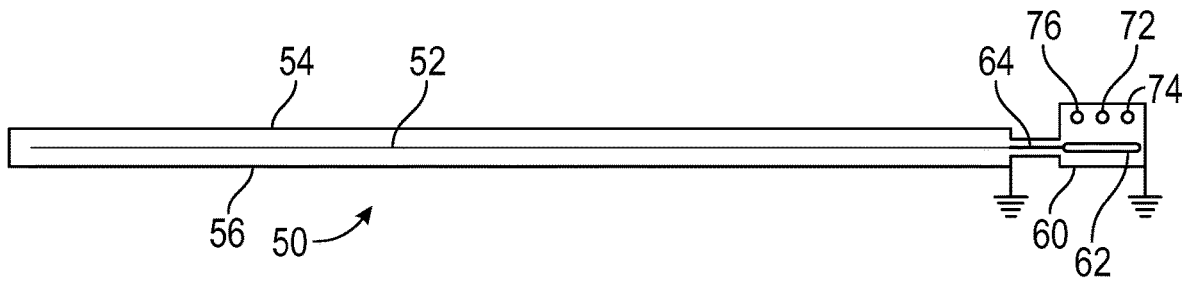
FIG. 5B is a diagrammatic side view of the display system of FIG. 5A.

Referring to FIGS. 3, 5A and 5B, the display electronics receives video input signals, in this exemplary embodiment, from a video input 72, a non-ferrous cable, or from fiber-optic video input 74. DC power is provided to the electronics module by DC input 76, typically by a non-ferrous cable connected to a DC power source either outside the MRI magnet room or some distance away from the MRI magnet so as to not affect the MRI imaging process. The video input signals can be provided by a video source located in the MRI control room as described below with respect to FIGS. 6 and 7, or inside the magnet room some distance away from the MRI tube. In an alternate embodiment, to reduce the cost of wiring and fiber optics, Wi-Fi could be used to transmit the video signals to the display electronics from the control room.

Figure 4:
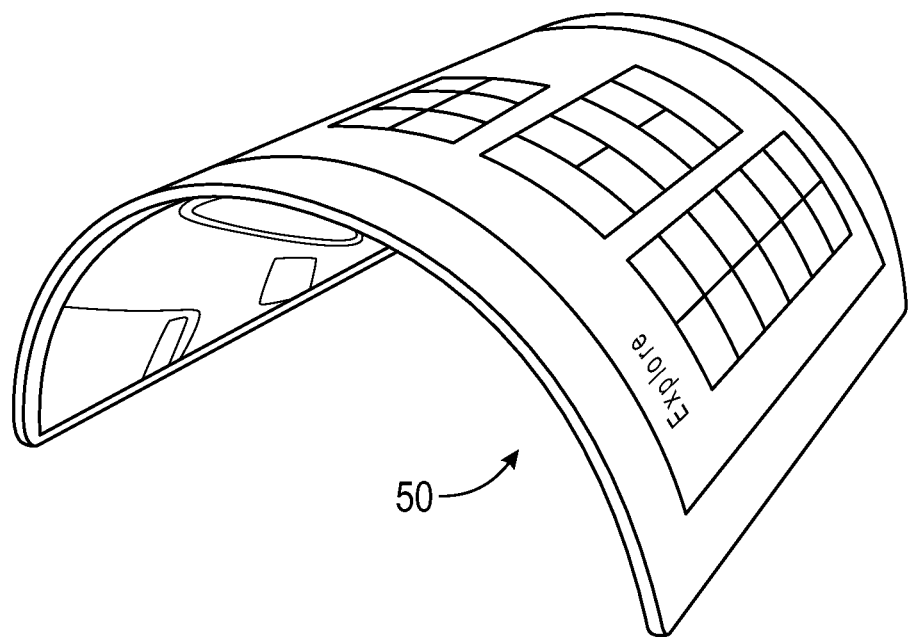
FIG. 4 is a diagrammatic view of a curved display panel suitable for use in the MRI bore.

While the disclosed embodiment employs an AMOLED display structure, other curved display structures may alternatively be employed. OLED and AMOLED displays are presently preferred, but in the future other curved or rigid curved displays can be adapted. For a given diameter of the MRI bore, the display factory could develop the perfectly matching fixed curved display. FIG. 4 illustrates an embodiment of the curved display 50. In this example, the display is translucent and may display images on both sides of the display, so that the patient views both images. Alternatively, the display may be configured to generate images only on one surface, typically the inside surface facing the patient. In some applications, the display can display commands to the patient, e.g. to hold his breath or to breathe, or some other task that is to be performed by the patient.

FIGS. 5A and 5B illustrate the display system in further detail. The display 50 is shown in a flat condition for clarity. In an exemplary embodiment, the screen may have a width of one meter and a length of two meters to cover virtually the entire length of the MRI bore. The AMOLED screen 52 is sandwiched between the two EMI shield layers 54 and 56, which are connected to each other at the periphery to form a shield enclosure of the screen 52. The enclosure is grounded. The display electronics module 62 is encased in housing 60 which is also grounded. The display electronics module includes a printed circuit board with driver electronics. A ribbon cable 64 connects the driver electronics to the screen 52.

Figure 6:
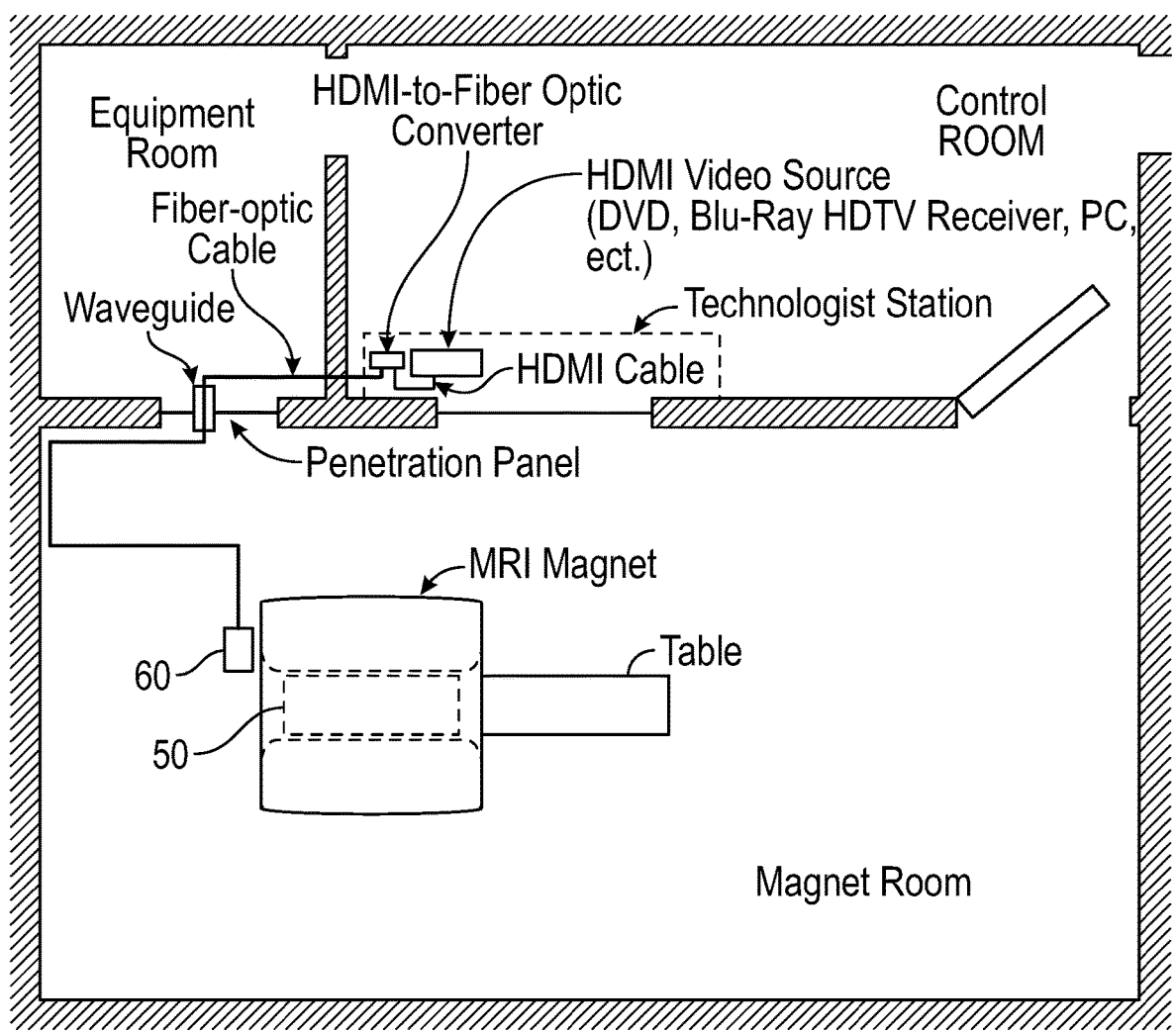
FIG. 6 is a diagrammatic illustration of an MRI suite employing a curved display configured for presenting a three-dimensional image effect to the patient in the MRI bore.

FIG. 6 illustrates a typical component layout within an MRI suite. In this exemplary layout, the MRI magnet is disposed in the magnet room, with a patient table for positioning the patient in the bore of the MRI magnet. The curved display 50 is positioned within the MRI magnet bore as illustrated above in FIG. 2B, for example. In this exemplary embodiment, the curved display employs FPR technology to provide a 3D effect when used with an appropriate set of goggles or glasses, with circular polarization filters of opposite sense through which the image generated by the 3D display 50 is viewed.

The control room includes the Technologist Station for controlling the MRI system. An FPR-compatible video source capable of generating signals to produce the 3D image is placed in the control room, and its signal is converted (e.g., through an HDMI-to-Fiber Optic Converter) to an optical signal carried on an optical fiber. The video source may be, for example, a DVD player, HDTV receiver, a PC, etc. The optical fiber is passed from the control room into the equipment room and through a waveguide positioned in a penetration panel to the magnet room and to the driver module 60 for the curved display 50. Alternatively, in another embodiment, the video source signals may be broadcast using a Wi-Fi broadband network, wherein a Wi-Fi repeater is used to transmit signals (e.g., from an antenna mounted to the magnet room wall).

Figure 7:
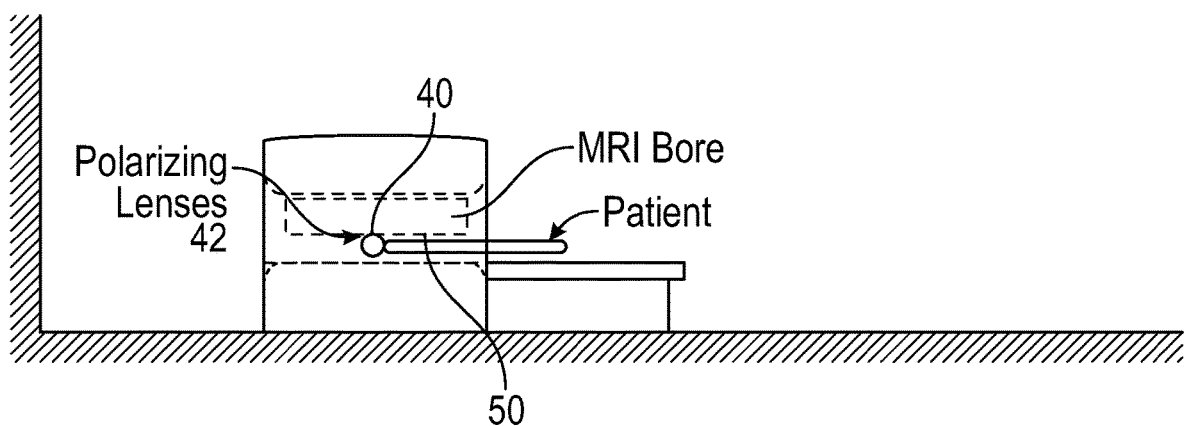
FIG. 7 illustrates the patient setup for the system of FIG. 6.

FIG. 7 illustrates the patient setup for the system of FIG. 6 in further detail. The patient wears the circular polarized passive glasses or goggles 40 with lenses 42 having circular polarization filters of opposite polarization sense for the left and right eye, typically applied by a filter film, and can view the 3D display 50. The patient goggles 40 are configured to be non-magnetic and MRI-compatible. The patient goggles are typically fabricated of a very thin layer of optically clear plastic on which the filters are formed, and, because of the thinness, do not affect substantially the 3D image quality.

Although the foregoing has been a description and illustration of specific embodiments of the subject matter, various modifications and changes thereto can be made by persons skilled in the art without departing from the scope and spirit of the invention.

The invention claimed is:

1. A display structure configured for use inside an MRI system bore to display images to a patient undergoing an MRI procedure, the MRI system bore having a longitudinal axis and an interior curved ceiling surface faced by the patient during the MRI procedure, the MRI system including a patient table riding on a cradle support structure, so that the table and patient can be moved into and out of the MRI system bore to position the patient for the MRI procedure, the display structure comprising:

a curved electronic display structure configured to be fitted inside the MRI system bore and fixed in place and positioned against the curved interior ceiling surface of the MRI system bore and having a display axis extending along the MRI system bore, the curved electronic display structure configured to be responsive to display drive signals to generate images, the curved electronic display structure having a sector size and a longitudinal length along the axis of the MRI system bore sufficient to present images to the patient inside the MRI system bore undergoing the MRI procedure;

the curved electronic display structure including electromagnetic interference shielding sandwiching the curved electronic display structure, the shielding sufficiently optically transparent to permit patient viewing of images formed on the display structure while preventing emission of RF energy to affect MRI imaging;

the curved electronic display structure comprising a flexible or rigid display screen configured for mounting to the curved interior ceiling surface of the MRI system bore;

wherein the longitudinal extent of the display screen of the curved electronic display structure extends from at or adjacent a patient entry edge of the MRI system bore to at least a position at the patient's head in the MRI system bore when undergoing the MRI procedure.

2. The display structure of claim 1, wherein the longitudinal extent of the display screen is 200 cm or longer.

3. The display structure of claim 2, wherein the display screen is flexible and has a width in a flattened state of about one meter.

4. The display structure of claim 1, wherein the display screen is configured for positioning within the MRI system bore over the patient's head, so that, with the patient positioned for the MRI procedure, the display screen of the curved electronic display structure is within view of the patient's eyes.

5. The display structure of claim 1, wherein said electromagnetic interference shielding comprising first and second layers formed by a very fine micro mesh almost invisible to the naked eyes to sandwich the curved electronic display structure for blocking display noise RF interference from radiating outside the shielding to the imaging environment.

6. The display structure of claim 1, wherein the sector size of the display screen of the curved electronic display structure has a lateral extent of at least about 180 degrees or more.

7. The display structure of claim 1, wherein the sector size of the display screen has a lateral extent of about 45 degrees.

8. The display structure of claim 1, wherein the display screen comprises an AMOLED display screen.

9. The display structure of claim 1, wherein the display screen comprises an OLED display screen.

10. The display structure of claim 1, wherein the display screen has a first side configured for placement within the MRI system bore to face the patient undergoing the MRI procedure and a second side configured to face the interior curved ceiling surface of the MRI system bore, and wherein the display screen is translucent and configured to display images on each of the first side and the second side.

11. A display structure configured for use inside a patient imaging system bore to display images to a patient undergoing an imaging procedure, the patient imaging system bore having a longitudinal extent and an inner curved ceiling surface during the imaging procedure, the display structure comprising:
   a curved electronic display screen configured for fitting inside the-patient imaging system bore and fixing in place against the curved ceiling surface of the patient imaging system bore and conforming to a ceiling surface curvature, the curved electronic display screen configured to be responsive to display drive signals to generate images and having a width and length sufficient to present images to the patient inside the patient imaging system bore undergoing the imaging procedure; and
   a shielding structure sandwiching the display screen, the shielding structure comprising first and second layers formed by a very fine micro mesh almost invisible to the naked eyes to sandwich the curved electronic display structure for blocking display noise RF interference from radiating outside the shielding to the imaging environment.

12. The display structure of claim 11, wherein said width at least covering 45 degrees of the ceiling surface curvature.

13. The display structure of claim 11, wherein said width covers at least 180 degrees of the ceiling surface curvature.

14. The display structure of claim 11, wherein said length of the display screen extends from at or adjacent a patient entry edge of the patient imaging system bore to at least a position at the patient's head in the patient imaging system bore when undergoing the imaging procedure.

15. The display structure of claim 11, wherein said length of the curved electronic display structure above a patient's head in the patient imaging system bore is about 20 cm.

16. The display structure of claim 11, wherein the display screen comprises an AMOLED display screen.

17. The display structure of claim 11, wherein the display screen comprises an OLED display screen.

18. The display structure of claim 11, wherein the display screen has a first side configured for placement within the patient imaging system bore to face the patient undergoing the imaging procedure and a second side configured to face the interior curved ceiling surface of the patient imaging system bore, and wherein the display screen is translucent and configured to display images on each of the first side and the second side.

\* \* \* \* \*